US006451506B1

(12) United States Patent
Verlinden et al.

(10) Patent No.: US 6,451,506 B1
(45) Date of Patent: Sep. 17, 2002

(54) MATERIAL FOR PRODUCING A LITHOGRAPHIC PRINTING PLATE COMPRISING A GLASS SUPPORT

(75) Inventors: Bart Verlinden, Tongeren; Luc de Brabandere, Lier, both of (BE)

(73) Assignee: Agra-Gevaert, Mortsel (BE)

( * ) Notice: Subject to any disclaimer, the term of this patent is extended or adjusted under 35 U.S.C. 154(b) by 1147 days.

(21) Appl. No.: 08/744,268

(22) Filed: Nov. 6, 1996

Related U.S. Application Data

(63) Continuation-in-part of application No. 08/567,037, filed on Dec. 4, 1995.

(30) Foreign Application Priority Data

May 21, 1996 (EP) ........................................... 96201372

(51) Int. Cl.$^7$ ............................ G03F 7/26; C03C 1/52; C03C 8/00

(52) U.S. Cl. ....................... 430/302; 430/153; 430/171; 430/204; 430/944; 430/945

(58) Field of Search ................................ 430/171, 204, 430/153, 300, 303, 302, 363, 927, 944, 945

(56) References Cited

U.S. PATENT DOCUMENTS

| | | | | | |
|---|---|---|---|---|---|
| 4,046,071 | A | * | 9/1977 | Mizuno et al. | 101/395 |
| 5,378,580 | A | * | 1/1995 | Leenders | 430/303 |
| 5,462,833 | A | * | 10/1995 | Hauquier et al. | 430/159 |
| 5,536,618 | A | * | 7/1996 | De Keyzer et al. | 430/204 |

* cited by examiner

*Primary Examiner*—Thorl Chea
(74) *Attorney, Agent, or Firm*—Breiner & Breiner, L.L.C.

(57) ABSTRACT

A material for making a lithographic printing plate is provided comprising on a glass support a surface capable of being differentiated in ink accepting and ink repellant areas in accordance with an image pattern, characterised in that the glass support has a thickness of not more than 0.5 mm, a failure stress of at least $10^7$ Pa and a Youngs modulus of not more than $10^{11}$ Pa.

20 Claims, No Drawings

MATERIAL FOR PRODUCING A LITHOGRAPHIC PRINTING PLATE COMPRISING A GLASS SUPPORT

This application is a continuation in part application of U.S. application Ser. No. 08/567,037, filed on Dec. 4, 1995 and entitled "Process for applying any layer on glass presented in roll form".

FIELD OF THE INVENTION

This invention relates to a material for producing a lithographic printing plate comprising a thin glass support.

BACKGROUND OF THE INVENTION

Lithographic printing is the process of printing from specially prepared surfaces, some areas of which are capable of accepting ink (oleophilic areas) whereas other areas will not accept ink (oleophobic areas). The oleophilic areas form the printing areas while the oleophobic areas form the background areas.

Two basic types of lithographic printing plates are known. According to a first type, so called wet printing plates, both water or an aqueous dampening liquid and ink are applied to the plate surface that contains hydrophilic and hydrophobic areas. The hydrophilic areas will be soaked with water or the dampening liquid and are thereby rendered oleophobic while the hydrophobic areas will accept the ink. A second type of lithographic printing plates operates without the use of a dampening liquid and are called driographic printing plates. This type of printing plates comprise highly ink repellant areas and oleophilic areas. Generally the highly ink repellant areas are formed by a silicon layer.

Common supports for use in lithographic printing plates are e.g. metal supports in particular grained and anodized aluminum or supports comprising a substrate such as e.g. paper or plastic film provided with a hydrophilic layer, preferably a hydrophilic layer that is cross-linked.

In lithographic printing plates it is important to use a support having high dimensional stability and high resistance against chemical influences. Glass is a support having very high dimensional stability and is highly unsensitive to chemical action. Therefore it would be a support of choice for lithographic printing plates if it were thin and flexible enough. Since different types of lithographic plate precursors, i.e. materials making it possible to produce a lithographic printing plates, are known in the art it is desirable to have a glass support that is useful for all types of lithographic printing plate precursors.

SUMMARY OF THE INVENTION

It is an object of the invention to provide a lithographic printing plate precursor having a support with high dimensional stability and good resistance to chemicals.

It is a further object of the invention to provide an alternative heat mode recording material for making a driographic printing plate of high quality and that preferably can be obtained without the need of solvent development or that can be obtained with ecologically more acceptable solvents and that comprises a support with high dimensional stability and good resistance to chemicals.

It is still a further object of the invention to provide a DTR (diffusion transfer) material, on a support with high dimensional stability and good resistance to chemicals for preparing a lithographic printing plate having good printing properties.

Further objects of the present invention will be clear from the description hereinafter.

The objects of the invention are realized by providing a material for making a lithographic printing plate comprising on a glass support a surface capable of being differentiated in ink accepting and ink repellant areas in accordance with an image pattern, characterized in that said glass support has a thickness of not more than 0.5 mm, a failure stress of at least $10^7$ Pa and a Youngs modulus of not more than $10^{11}$ Pa.

DETAILED DESCRIPTION OF THE INVENTION

Using glass as support for a material intended for the production of lithographic printing plates has been hindered by the fact that most application methods of additional layers to a glass support are discontinuous processes. The difficulties of applying a layer to a glass support in a discontinuous process are enumerated in various documents, U.S. Pat. No. 4,033,290, U.S. Pat. No. 5,254,447 being of the most explicit.

It has been found than, when it is needed to apply a layer on a glass support, which is thinner than 1.2 mm, it is possible to supply the glass support on roll. This brings the great advantage that such a support can be coated in any continuous coating equipment for coating layers on plastic films. It was found that when glass is not thicker than 1.2 mm it can be presented in roll form and thus be unwound and coated as a web in a continuous coating machine. This is particularly so when said glass support has an elasticity modulus (Young's modulus) equal or lower than $10\times10^{10}$ Pa, preferably lower than $7\times10^{10}$ Pa. When said glass has moreover a failure stress (under tensile stress) equal to or higher than $1\times10^7$ Pa, preferably higher than $4\times10^7$ Pa, it is even easier to present it in roll form. When the glass fulfills these requirements, it can, depending on the thickness, be presented on rolls wound upon a core, said core having a diameter between 0.1 m and 3 m.

It was also found that, when the glass support is thinner than 1.2 mm, has an elasticity modulus (Young's modulus) lower than $10\times10^{10}$ Pa, preferably lower than $7\times10^{10}$ Pa, and a failure stress (under tensile stress) higher than $4\times10^7$ Pa, it can, depending on the thickness, be presented on rolls wound upon a core having a diameter between 0.1 m and 1.6 m. When the glass support has an elasticity modulus (Young's modulus) lower than $10\times10^{10}$ Pa, preferably lower than $7\times10^{10}$ Pa, and a failure stress (under tensile stress) higher than $4\times10^7$ Pa, and is not more than 0.8 mm tick, it can be presented on rolls wound upon a core having a diameter between 0.1 m and 1.2 m.

For use as support in a lithographic printing plate precursor, i.e. a material for the production of lithographic printing plates, it is preferred that the glass support is less than 0.5 mm thick.

It was found that it was possible to produce a material for making a lithographic printing plate, having a surface capable of being differentiated in ink accepting and ink repellant areas in accordance with an image pattern, on a glass support and being flexible. The glass support for such a material was preferably less than 0.5 mm thick, had a failure stress of at least $10^7$ Pa and a Youngs modulus of not more than $10^{11}$ Pa.

In one embodiment of the invention, the material further comprises a hydrophilic layer formed of a cross-linked hydrophilic polymer. A particularly suitable cross-linked hydrophilic layer may be obtained from a hydrophilic binder cross-linked with a cross-linking agent such as formaldehyde, glyoxal, polyisocyanate or a hydrolyzed tetra-alkylorthosilicate. The latter is particularly preferred. As hydrophilic binder there may be used hydrophilic (co) polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

The amount of cross-linking agent, in particular of tetraalkyl orthosilicate, is preferably at least 0.2 parts by weight per part by weight of hydrophilic binder, preferably between 0.5 and 5 parts by weight, more preferably between 1.0 parts by weight and 3 parts by weight.

A cross-linked hydrophilic layer in accordance with the present invention preferably also contains substances that increase the mechanical strength and the porosity of the layer.

For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stober as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the cross-linked hydrophilic layer is given a uniform rough texture consisting of microscopic hills and valleys, which serve as storage places for water in background areas. The thickness of a cross-linked hydrophilic layer may vary in the range of 0.2 to 25 $\mu$m and is preferably 1 to 10 $\mu$m.

Further particular examples of suitable cross-linked hydrophilic layers for use in accordance with the present invention are disclosed in EP-A 601240, GB-P-1419512, FR-P-2300354, U.S. Pat. No. 3,971,660, U.S. Pat. No. 4,284,705 and EP-A 514490.

A very suitable material for making lithographic printing plates is a material comprising on a glass support a surface capable of being differentiated in ink accepting and ink repellant areas in accordance with an image pattern, characterized in that i) said glass support has a thickness of not more than 0.5 mm, a failure stress of at least $10^7$ Pa and a Youngs modulus of not more than $10^{11}$ Pa and ii) said material further comprises a photo-sensitive layer.

More preferred materials for making a lithographic printing plate are materials comprising on a glass support a surface capable of being differentiated in ink accepting and ink repellant areas in accordance with an image pattern, characterized in that i) said glass support has a thickness of not more than 0.5 mm, a failure stress of at least $10^7$ Pa and a Youngs modulus of not more than $10^{11}$ Pa, ii) said material further comprises a hydrophilic layer formed of a cross-linked hydrophilic polymer and iii) said surface capable of being differentiated in ink accepting and ink repellant areas comprises a photosensitive layer.

A photosensitive layer in accordance with the present invention may comprise any suitable light-sensitive composition from which an ink accepting image on the hydrophilic surface of the support of the imaging element can be obtained. Examples of such light-sensitive compositions used herein are those comprising diazo compounds; those comprising azide compounds as disclosed in U.K. Patent Nos. 1,235,281 and 1,495,861; those containing photo-cross-linkable photopolymers as disclosed in U.S. Pat. Nos. 4,072,528 and 4,072,527 and in particular those described in more detail below.

Among these light-sensitive compositions, preferably used are those comprising diazo compounds since they are synthetically excellent in various properties such as storage properties of the photosensitive layer; developability, for instance, development latitude; image properties, e.g. quality of images; printing properties, e.g., ink receptivity and wear resistance; and low possibility of causing environmental pollution of developers used.

The light-sensitive compositions containing diazo compounds can roughly be divided in two groups, i.e. negative-working type and positive-working type ones.

The negative-working light-sensitive compositions containing diazo compounds comprise light-sensitive diazo compounds and preferably polymeric compounds. As the light-sensitive diazo compounds there may be used any ones conventionally known and preferred examples thereof are salts of organic solvent-soluble diazo resins such as salts of condensates of p-diazodiphenylamine and formaldehyde or acetaldehyde with hexafluorophosphates and salts thereof with 2-hydroxy-4-methoxybenzophenone-5-sulfonic acid salts.

On the other hand, examples of the foregoing polymeric compounds preferably used are copolymers of acrylic acid or methacrylic acid; crotonic acid copolymers; itaconic acid copolymers, maleic acid copolymers, cellulose derivatives having carboxyl groups on the side chains thereof, polyvinyl alcohol derivatives having carboxyl groups on the side chains thereof, copolymers of hydroxyalkyl (meth)acrylate having carboxyl groups on the side chains thereof, and unsaturated polyester resins having carboxyl groups.

As the diazo compounds used in a positive-working light-sensitive composition, any compounds conventionally known may be utilized and typical examples thereof are o-quinonediazides and preferably o-naphthoquinonediazide compounds. Particularly preferred are o-naphthoquinonediazidosulfonic acid esters or o-naphthoquinone diazidocarboxylic acid esters of various hydroxyl compounds; and o-naphthoquinonediazidosulfonic acid amides or o-naphthoquinonediazidocarboxylic acid amides of various aromatic amine compounds. Examples of such phenols include phenol, cresol, resorcin and pyrogallol; examples of such carbonyl group-containing compounds are formaldehyde, benzaldehyde and acetone. Examples of preferred hydroxyl compounds include phenol-formaldehyde resin, cresol-formaldehyde resin, pyrogallol-acetone resin and resorcin-benzaldehyde resin.

Typical examples of o-quinonediazide compounds include esters of benzoquinone-(1,2)-diazidosulfonic acid or napthoquinone-(1,2)-diazidosulfonic acid and phenol-formaldehyde resin or cresol-formaldehyde resin; ester of naphthoquinone-(1,2)-diazido-(2)-5-sulfonic acid and pyrogallol-acetone resin as disclosed in U.S. Pat. No. 3,635,709; and ester of naphthoquinone-(1,2)-diazido-(2)-5-sulfonic acid and resorcin-pyrogallol-acetone copolycondensates as disclosed in J.P. KOKAI No. Sho 55-76346.

Examples of other useful o-quinonediazide compounds are polyesters having hydroxyl groups at their termini esterified with o-napthoquinonediazidesulfonyl chloride as disclosed in J.P. KOKAI No. Sho 50-117503; homopolymers of p-hydroxystyrene or copolymers thereof with other copolymerizable monomers esterified with o-naphtoquinonediazidosulfonyl chloride as disclosed in J.P. KOKAI No. Sho 50-113305; ester of bisphenol-formaldehyde resin and o-quinonediazidosulfonic acid as disclosed in J.P. KOKAI No. Sho 54-29922; condensates of alkyl acrylate-acryloyoxyalkyl carbonate—hydroxyalkyl acrylate copolymers with o-naphthoquinonediaziosulfonyl chloride as disclosed in U.S. Pat. No. 3,859,099; reaction products of copolymerized products of styrene and phenol derivatives with o-quinonediazidosulfonic acid as disclosed in J.P. KOKOKU No. Sho 49-17481; amides of copolymers of p-aminostyrene and monomers copolymerizable therewith and o-naphthoquinonediazidosulfonic acid or o-naphthoquinonediazidocarboxylic acid as disclosed in U.S. Pat. No. 3,759,711; as well as ester compounds of polyhydroxybenzophenone and o-naphthoquinonediazidosulfonyl chloride.

These o-quinonediazide compounds may be used alone, but are preferably used as a mixture with an alkali-soluble resin to form a light-sensitive layer.

Preferred alkali-soluble resins include novolak type phenol and typical examples thereof are phenolformaldehyde, cresol-formaldehyde resin, and phenol-cresol-formaldehyde copolycondensed resins as disclosed in J.P. KOKAI No. Sho 55-57841. More preferably, the foregoing phenol resins are simultaneously used with a condensate of phenol or cresol substituted with an alkyl group having 3 to 8 carbon atoms and formaldehyde such as t-butylphenol-formaldehyde, as described in J.P. KOKAI No. Sho 50-125806.

Moreover, it is also possible to optionally incorporate, into the light-sensitive composition, alkali-soluble polymers other than the above listed alkali-soluble novolak phenolic resins. Examples of such polymers are styrene-acrylic acid copolymer, methyl methacrylate-methacrylic acid copolymer, alkali-soluble polyurethane resin, and alkali-soluble vinylic resins and alkali-soluble polybutyral resins as disclosed in J.P. KOKOKU No. Sho 52-28401.

The amount of the o-quinonediazide compounds is preferably 5 to 80% by weight and more preferably 10 to 50% by weight based on the total weight of the solid contents of the light-sensitive composition. On the other hand, that of the alkali-soluble resins is preferably 30 to 90% by weight and more preferably 50 to 85% by weight based on the total weight of the solid contents of the light-sensitive composition.

A photosensitive layer in connection with this invention may be applied in the form of a multilayered structure. Moreover, the light-sensitive composition in the photosensitive layer or multi-layer package may further comprise optional components such as dyes, plasticizers and components for imparting printing-out properties (ability of providing a visible image immediately after imagewise exposure).

The coated amount of a photosensitive layer applied onto the hydrophilic surface of a support preferably ranges from 0.1 to 7 $g/m^2$ and more preferably 0.5 to 4 $g/m^2$.

Preferred photo-cross-linking materials in the present invention are based on photo-cross-linking polymers having a maleimido group at their side chain. In order to elevate their photosensitivity sensitisers are added such as thioxanthones, benzophenone, Michler's ketone, anthraquinones, anthracene, chrysene, p-dinitrobenzene, 2-nitrofluorene, as well as sensitizers described in JP-A-62-294238, JP-A-2-173646, JP-A-2-236552, JP-A-3-54566 and JP-A-6-107718. (The term "JP-A" as used herein means an "unexamined published Japanese patent application".)

A photo-cross-linking polymer having a maleimido group at its side chain(s) includes, for example polymers that are described in U.S. Pat. No. 4,079,041 (corresponding to JP-A-52-988); West German Patent 2,626,769; European Patents 21,019 and 3,552; Die Angewandte Makromolekulare Chemie, 115 (1983), pp. 163-181; JP-A-49-128991 to JP-A-49-128993, JP-A-50-5376 to JP-A-50-5380, JP-A-53-5298 to JP-A-53-5300, JP-A-50-50107, JP-A-51-47940, JP-A-52-13907, JP-A-50-45076, JP-A-52-121700, JP-A-50-10844, JP-A-50-45087, JP-A-58-43951; West German Patents 2,349,948 and 2,616,276.

Of these polymers, those having, at their side chains, two or more maleimido groups on average in one molecule and having a mean molecular weight of 1000 or more are preferably used in the present invention.

An imaging element containing any of these polymers is preferably developed with an aqueous alkaline developer substantially not containing an organic solvent, in view of the environmental safety. Therefore, it is preferable that these polymers are soluble in or swellable with aqueous alkalis. Accordingly, it is preferably that monomers having a maleimido group at its side chain are copolymerized with monomers having a alkali-soluble group to obtain these polymers.

As the alkali-soluble group, preferred are acid groups having a pKa of 14 or less. Specific examples of such monomers having an alkali-soluble group include vinyl monomers having a carboxyl group, such as acrylic acid, methacrylic acid, maleic acid, itaconic acid; vinyl monomers having a -$CONHSO_2$-group; vinyl monomers having an —$SO_2NH$-group; vinyl monomers having a phenolic hydroxyl group; vinyl monomers having a phosphoric acid group or a phosphonic acid group; as well as maleic anhydride, and itaconic anhydride.

The alkali-soluble group having monomer and the maleido group having monomer are generally copolymerized at a ratio of from 10/90 to 70/30 by mol, preferably from 20/80 to 60/40 by mol, to easily give a photo-cross-linking polymer for use in the present invention. The polymer has preferably an acid value of from 30 to 500, especially preferably from 50 to 300.

Of such photo-cross-linking polymers, especially useful are copolymers composed of an N-[2-methacryloyloxy) alkyl]-2,3-dimethylmaleimide and methacrylic acid or acrylic acid, such as those described in Die Angewandte Makromolekulare Chemie, 128 (1984), pp. 71–91. In producing these copolymers, vinyl monomers may additionally copolymerized, as the third component, to easily give polynary copolymers as desired. For instance, alkyl methacrylates or alkyl acrylates of which homopolymers have a glass transition temperature not higher than room temperature can be copolymerized as the third component to give flexible copolymers.

A photo-cross-linking polymer for use in the present invention has preferably a weight average molecular weight of 1000 or more, more preferably from 10,000 to 500,000, and even more preferably from 20,000 to 300,000.

As mentioned above, it is desirable to add a sensitizer to a photosensitive layer having a photo-cross-linkable polymer as described above. Preferred is a triplet sensitizer having an absorption peak for ensuring sufficient light absorption at 300 nm or more.

Examples of such sensitizer include benzophenone derivatives, benzanthrone derivatives, quinones, aromatic nitro compounds, naphthothiazoline derivatives, benzothiazoline derivatives, thioxanthones, naphthothiazole derivatives, ketocoumarin compounds, benzothiazole derivatives, naphthofranone compounds, pyrylium salts, and thiapyrylium salts.

Specific examples thereof include Michler's ketone, N,N'-diethylaminobenzophenone, benzanthrone, (3-methyl-1,3-diazo-1,9-benz)anthronepicramide, 5-nitroacenaphthene, 2-chlorothioxanthone, 2-isopropylthioxanthone, dimethylthioxanthone, methylthioxanthone-1-ethyl carboxylate, 2-nitrofluorenone, 2-dibenzoylmethylene-3-methylnaphthothiazoline, 3,3-carbonyl-bis-(7-diethylaminocoumarin), 2,4,6-triphyenlthiapyrylium perchlorate, 2-(p-chlorobenzoy)naphthothiazole, as well as sensitizers described in Jp-B-45-8832, JP-A-52-129791, JP-A-62-294238, JP-A-2-173646, JP-A-2-131236, European Patent 368,327, JP-A-2-236552, JP-A-3-54566 and JP-A-6-107718.

Of these, preferred are the sensitizers described in JP-A-2-236552, JP-A-3-54566 and JP-A-6-107718; and especially preferred are the sensitizers having one or more of —COOH, —$NHSO_2R^{20}$, —$CONHCOR^{20}$ and/or —$CONHSO_2R^{20}$ (where $R^{20}$ represents an alkyl group, an aromatic group or an alkyl-aromatic group) as an alkali-soluble group in one molecule, described in JP-A-6-107718.

The amount of sensitizer in the photosensitive layer is conveniently from 1 to 20% by weight, preferably from 2 to 15% by weight, and more preferably from 3 to 10% by weight, of the total amount of the compositions in the photosensitive layer.

In addition to the photo-cross-linkable polymers described above it may be desirable to add a diazo resin to the photosensitive layer. Examples of diazo resins include co-condensates composed of aromatic diazonium compounds and aldehydes. Specific examples thereof include the diazo resins described in JP-B-49-48001, JP-B-50-7481, JP-B-5-2227, JP-A-3-2864, JP-A-3-240061, and JP-A-4-274429.

Of these, preferred are diazo resins having a carboxyl group in the molecule, for example, diazo resins obtained by co-condensation with aromatic compounds having at least one carboxyl group, such as those described in JP-A-3-240061, and diazo resins obtained by condensation with aldehydes having a carboxyl group, such as those described in JP-A-2864.

The amount of the diazo resin in the photosensitive layer is preferably from 0.1 to 30% by weight, preferably from 0.5 to 10% by weight, and more preferably from 1 to 5% by weight of the total amount of the compositions in the photosensitive layer.

Further, there may be added a polymer having one or more polymerizable groups such as the polymers disclosed in JP-B-3-63740, U.S. Pat. Nos. 3,376,138, 3,556,793.

The above-mentioned polymer having one or more polymerizable groups is preferably soluble in or swellable with aqueous alkaline developers, like the polymers having a maleimido group at the side chain. Therefore, this polymer is preferably a copolymer composed of one or more monomers having an alkali-soluble group, e.g. as mentioned above.

In another embodiment of the invention, the material for making the lithographic printing plate is a DTR (diffusion transfer) material, both in a two-sheet and in a mono-sheet process. In a two-sheet DTR process a sheet material comprising a silver halide material is image wise exposed and then contacted with a second sheet material, according to the present invention, comprising an image receiving layer with physical development nuclei. The sandwich of the two sheets is then processed and during this processing silver ions migrate to the image receiving layer and are precipitated on the physical development nuclei. In a mono-sheet DTR process both the silver halide layer and the image receiving layer are present in the same sheet material.

In preparing a two-sheet DTR material, the image receiving layer comprising physical development nuclei is provided on a glass support according to the present invention. Said glass support is first provided with a layer comprising a cross-linked hydrophilic polymer and on this hydrophilic polymer layer, a layer comprising physical development nuclei is provided, forming an image receiving layer. This image receiving layer is then used in a two-sheet DTR process. During the production of a lithographic printing plate a substance is image-wise transferred to the surface of said material thereby differentiating said surface in ink accepting and ink repellant areas in accordance with the image pattern being transferred.

The image receiving layer containing physical development nuclei is preferably free of hydrophilic binder but may comprise small amounts up to 30% by weight of the total weight of said layer of a hydrophilic colloid e.g. polyvinyl alcohol to improve the hydrophilicity of the surface.

Preferred development nuclei for use in accordance with the present invention are sulphides of heavy metals e.g. sulphides of antimony, bismuth, cadmium, cobalt, lead, nickel, palladium, platinum, silver, and zinc. Especially suitable development nuclei in connection with the present invention are palladium sulphide nuclei. Other suitable development nuclei are salts such as e.g. selenides, polyselenides, polysulphides, mercaptans, and tin (II) halides. Heavy metals, preferably silver, gold, platinum, palladium, and mercury can be used in colloidal form.

The glass support according to the present invention is also well suited for the production of a monosheet DTR material. A mono-sheet DTR material for producing a lithographic printing plate can be implemented in two forms. In a first implementation a DTR mono-sheet material for the production of a lithographic printing plate comprises a glass support, according to the present invention, and in the order given i) a hydrophilic polymer layer, which can optionally be cross-linked, ii) an image receiving layer comprising physical development nuclei and iii) a silver halide photographic emulsion layer. In a second implementation a DTR mono-sheet material for the production of a lithographic printing plate comprises a glass support, according to the present invention, and in the order given i) a silver halide photographic emulsion layer and ii) an image receiving layer comprising physical development nuclei.

The hydrophilic polymer layer useful in the first embodiment of a DTR mono-sheet material for the production of a lithographic printing plate can be a hydrophilic polymer layer as described herein above. The image receiving layer comprising physical development nuclei useful in a mono-sheet DTR material, according to this invention, can be the same as the image receiving layers described herein above.

The support of this sheet material is a glass support according to this invention. In a mono-sheet DTR material, an image receiving layer is provided with a photosensitive layer in water permeable contact with said image receiving layer. Layers being in water permeable contact with each other are layers that are contiguous to each other or only separated from each other by (a) water permeable layer(s). The nature of a water permeable layer is such that it does not substantially inhibit or restrain the diffusion of water or of compounds contained in an aqueous solution e.g. developing agents or the complexed silver.

The photosensitive material used both in a mono-sheet DTR process and in a two-sheet DTR process, with a material for making lithographic printing plates according to the present invention, can be any layer comprising a hydrophilic colloid binder and at least one silver halide emulsion, at least one of the silver halide emulsions being photosensitive.

The photographic silver halide emulsion(s) used in accordance with the present invention can be prepared from soluble silver salts and soluble halides according to different methods as described e.g. by P. Glafkides in "Chimie et Physique Photographique", Paul Montel, Paris (1967), by G. F. Duffin in "Photographic Emulsion Chemistry", The Focal Press, London (1966), and by V. L. Zelikman et al in "Making and Coating Photographic Emulsion", The Focal Press, London (1966).

For use according to the present invention the silver halide emulsion or emulsions preferably consist principally of silver chloride while a fraction of silver bromide may be present ranging from 1 mole % to 40 mole %. Most preferably a silver halide emulsion containing at least 70 mole % of silver chloride is used.

The average size of the silver halide grains may range from 0.10 to 0.70 $\mu$m , preferably from 0.25 to 0.45 $\mu$m.

Preferably during or after the precipitation stage iridium and/or rhodium containing compounds or a mixture of both are added. The concentration of these added compounds ranges from $10^{-8}$ to $10^{-3}$ mole per mole of $AgNO_3$, preferably between $10^{-7}$ and $10^{-5}$ mole per mole of $AgNO_3$.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-P 493,464 and 568,687, and polyamines such as diethylene triamine or derivatives of aminomethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R.KOSLOWSKY, Z. Wiss. Photogr. Photophys. Photochem. 46, 65–72 (1951).

Apart from negative-working silver halide emulsions that are preferred for their high photosensitivity, use can be made also of direct-positive silver halide emulsions that produce a positive silver image in the emulsion layer(s) and a negative image on the image-receiving layer.

Suitable direct positive silver halide emulsions for use in accordance with the present invention are silver halide emulsions that have been previously fogged or that mainly form an internal latent image.

Internal latent image-type silver halide emulsions that can be used in accordance with the present invention have been described in e.g. U.S. Pat. No. 2,592,250, 3,206,313, 3,271,157, 3,447,927, 3,511,662, 3,737,313, 3,761,276, GB-A 1,027,146, and JA Patent Publication No. 34,213/77. However, the silver halide emulsions used in the present invention are not limited to the silver halide emulsions described in these documents.

The other type of direct positive type silver halide emulsions for use in accordance with the present invention, which is of the previously fogged type, may be prepared by overall exposing a silver halide emulsion to light and/or by chemically fogging a silver halide emulsion. Chemical fog specks may be formed by various methods for chemical sensitization.

Chemical fogging may be carried out by reduction or by a compound which is more electropositive than silver e.g. gold salts, platinum salts, iridium salts etc., or a combination of both. Reduction fogging of the silver halide grains may occur by high pH and/or low pAg silver halide precipitation or digestion conditions e.g. as described by Wood J. Phot. Sci. 1 (1953), 163 or by treatment with reducing agents e.g. tin(II) salts which include tin(II)chloride, tin complexes and tin chelates of (poly)amino(poly)carboxylic acid type as described in British Patent 1,209,050, formaldehyde, hydrazine, hydroxylamine, sulphur compounds e.g. thiourea dioxide, phosphonium salts e.g. tetra(hydroxymethyl)- phosphonium chloride, polyamines e.g. diethylenetriamine, bis(p-aminoethyl)sulphide and its water-soluble salts, hydrazine derivatives, alkali arsenite, amine borane etc. or mixtures thereof.

When fogging of the silver halide grains occurs by means of a reducing agent e.g. thiourea dioxide and a compound of a metal more electropositive than silver especially a gold compound, the reducing agent is preferably used initially and the gold compound subsequently. However, the reverse order can be used or both compounds can be used simultaneously.

In addition to the above described methods of chemically fogging chemical fogging can be attained by using said fogging agents in combination with a sulphur-containing sensitizer, e.g. sodium thiosulphate or a thiocyanic acid compound e.g. potassium thiocyanate.

The silver halide emulsions of the DTR-element can be spectrally sensitized according to the spectral emission of the exposure source for which the DTR element is designed.

Suitable sensitizing dyes for the visible spectral region include methine dyes such as those described by F. M. Hamer in "The Cyanine Dyes and Related Compounds", 1964, John Wiley & Sons. Dyes that can be used for this purpose include cyanine dyes, merocyanine dyes, complex cyanine dyes, complex merocyanine dyes, homopolar cyanine dyes, hemicyanine dyes, styryl dyes and hemioxonol dyes. Particularly valuable dyes are those belonging to the cyanine dyes, merocyanine dyes, complex merocyanine dyes.

In the case of a conventional light source, e.g. tungsten light, a green sensitizing dye is needed. In case of exposure by an argon ion laser a blue sensitizing dye is incorporated. In case of exposure by a red light emitting source, e.g. a LED or a HeNe laser a red sensitizing dye is used. In case of exposure by a semiconductor laser special spectral sensitizing dyes suited for the near infra-red are required. Suitable infra-red sensitizing dyes are disclosed in i.a. U.S. Pat. No. 2,095,854, 2,095,856, 2,955,939, 3,482,978, 3,552,974, 3,573,921, 3,582,344, 3,623,881 and 3,695,888.

A preferred blue sensitizing dye, green sensitizing dye, red sensitizing dye and infra-red sensitizing dye in connection with the present invention are described in EP-A 554,585.

To enhance the sensitivity in the red or near infra-red region use can be made of so-called supersensitizers in combination with red or infra-red sensitizing dyes. Suitable supersensitizers are described in Research Disclosure Vol 289, May 1988, item 28952. The spectral sensitizers can be added to the photographic emulsions in the form of an aqueous solution, a solution in an organic solvent or in the form of a dispersion.

The silver halide emulsions may contain the usual emulsion stabilizers. Suitable emulsion stabilizers are azaindenes, preferably tetra- or penta-azaindenes, especially those substituted with hydroxy or amino groups. Compounds of this kind have been described by BIRR in Z. Wiss. Photogr. Photophys. Photochem. 47, 2–27 (1952). Other suitable emulsion stabilizers are i.a. heterocyclic mercapto compounds.

The silver halide emulsion layers usually contains gelatin as hydrophilic colloid binder. Mixtures of different gelatins with different viscosities can be used to adjust the rheological properties of the layer. But instead of or together with gelatin, use can be made of one or more other natural and/or synthetic hydrophilic colloids, e.g. albumin, casein, zein, polyvinyl alcohol, alginic acids or salts thereof, cellulose derivatives such as carboxymethyl cellulose, modified gelatin, e.g. phthaloyl gelatin etc.

When the material for making a lithographic printing plate, according the present invention is a mono-sheet DTR material comprising a glass support, according to the present invention, and in the order given i) a hydrophilic polymer layer, which can optionally be cross-linked, ii) an image receiving layer comprising physical development nuclei and iii) a silver halide photographic emulsion layer preferably the gelatin layer(s) is(are) substantially unhardened. Substantially unhardened means that when such gelatin layer is coated on a subbed polyethylene terephthalate film base at a dry thickness of 1.2 $g/m^2$, dried for 3 days at 57° C. and 35% R. H. and dipped in water of 30° C., said gelatin layer is dissolved for more than 95% by weight within 5 minutes.

The silver halide emulsions may contain pH controlling ingredients. Preferably at least one gelatin containing layer is coated at a pH value not below the iso-electric point of the gelatin to avoid interactions between said gelatin containing layer and another (optional) layer. Most preferably all the gelatin containing layers are coated at a pH value not below the iso-electric point of their gelatin. Other ingredients such as antifogging agents, development accelerators, wetting agents, and hardening agents for gelatin may be present. The silver halide emulsion layer may comprise light-screening dyes that absorb scattering light and thus promote the image sharpness. Suitable light-absorbing dyes are described in i.a. U.S. Pat. No. 4,092,168, U.S. Pat. No. 4,311,787 and DE-P 2,453,217.

More details about the composition, preparation and coating of silver halide emulsions suitable for use in accordance with the present invention can be found in e.g. Product Licensing Index, Vol. 92, December 1971, publication 9232, p. 107–109.

When the material for making a lithographic printing plate, according the present invention is a mono-sheet DTR material comprising a glass support, according to the present invention, and in the order given i) a hydrophilic polymer layer, which can optionally be cross-linked, ii) an image receiving layer comprising physical development nuclei and iii) a silver halide photographic emulsion layer, the material preferably also comprises an intermediate layer between the image receiving layer on the hydrophilic surface of a support and the photosensitive layer(packet) to facilitate the removal of said layer(packet) thereby uncovering the silver image formed in the image receiving layer by processing the imaging element.

In one embodiment, the intermediate layer is a water-swellable intermediate layer coated at a ratio of 0.01 to 2.0 $g/m^2$ and comprising at least one non-proteinic hydrophilic film-forming polymer e.g. polyvinyl alcohol and optionally comprising an antihalation dye or pigment as disclosed in EP-A-410500.

In another embodiment, the intermediate layer is a layer comprising hydrophobic polymer beads having an average diameter not lower than 0.2 μm and having been prepared by polymerization of at least one ethylenically unsaturated monomer. Preferably, said intermediate layer in dry condition comprises said hydrophobic polymer beads in an amount of up to 80% of its total weight. Further details are disclosed in EP-A-483415.

A supplemental intermediate layer, which may be present between said silver halide emulsion containing layer and said water-swellable intermediate layer or said intermediate layer comprising hydrophobic polymer beads may incorporate one or more ingredients such as i.a. antihalation dyes or pigment, developing agents, silver halide solvents, base precursors, and anticorrosion substances.

In a still further embodiment of the invention, there is provided, a driographic material for the production of a lithographic printing plate. This driographic material comprises a glass support, said glass support being at most 0.5 mm thick and having a failure stress of at least $10^7$ Pa and a Youngs modulus of not more than $10^{11}$ Pa. Although it is possible to implement any driographic material for producing lithographic printing plates on a glass support according to the present invention, it is preferred to use driographic materials as described in EP-A 573 091, that is incorporated herein by reference. The main advantage of these driographic materials is the fact that the need for the use of an organic solvent in the development is avoided or that at least ecologically more acceptable solvents can be used.

Therefore the driographic material comprising a glass support according to the present invention is a heat-mode recording material. Such a material is image-able by laser ablation and comprises on said glass support a first layer comprising a polymer and a second layer underlying said first layer, at least one of said first and second layer being characterized by efficient absorption of infrared radiation and said first and second layers exhibiting different affinities for a printing fluid selected from the group consisting of ink and an abhesive fluid for ink. Preferably this material comprises in said first layer a polysiloxane and is oleophobic. In a further embodiment said first layer of said driographic material comprises a conductive polymer layer, an infrared absorbing metal layer or an infrared absorbing compound dispersed in a polymeric binder. In this case the heat converting substance is contained in the oleophobic surface layer. The heat mode recording material, described herein above, contains a separate heat mode recording layer containing the heat converting substance comprised between the glass support and an oleophobic surface layer. Examples of substances capable of converting radiation into heat are e.g. carbon black, infrared or near infrared absorbing dyes or pigments, metals such as Bi, Sn, Te etc. or a combination thereof. Suitable infrared dyes are disclosed in e.g. U.S. Pat. No. 4,833,124, EP-321923, U.S. Pat. No. 4,772,583, U.S. Pat. No. 4,942,141, U.S. Pat. No. 4,948,776, U.S. Pat. No. 4,948,777, U.S. Pat. No. 4,948,778, U.S. Pat. No. 4,950,639, U.S. Pat. No. 4,950,640, U.S. Pat. No. 4,912,083, U.S. Pat. No. 4,952,552, U.S. Pat. No. 5,024,990, U.S. Pat. No. 5,023,229 etc. Suitable infrared pigments are e.g. HEUCODOR metal oxide pigments available from Heubach Langelsheim. When a metal such as e.g. bismuth is used as a heat converting substance the recording layer is preferably a vacuum deposited metal layer.

In a heat mode recording material on a glass support according to the present invention the thickness of the recording layer may not be more than 3 μm in order to obtain a printing plate of acceptable quality, more preferably the thickness will be less than 2.5 μm. Typically the recording layer preferably has a thickness between 15 nm and 1.5 μm. The maximum thickness of 3 μm of the recording layer is especially important when exposure is carried out through the support. The heat mode recording layer used in connection with the present invention may contain a binder e.g. gelatin, cellulose, cellulose esters e.g. cellulose acetate, nitrocellulose, polyvinyl alcohol, polyvinyl pyrrolidone, a copolymer of vinylidene chloride and acrylonitrile, poly (meth)acrylates, polyvinyl chloride, silicone resin etc. The recording layer may further contain other ingredients such as e.g. wetting agents, matting agents, anti-oxidizing agents etc.. Preferably the heat mode recording layer contains a polymer containing covalently bound chlorine. Alternatively part or all of this polymer may be contained in a separate layer located adjacent to the heat mode recording layer and most preferably between the support and the heat mode recording layer. The heat mode recording layer in connection with the present invention may be hardened. For example a nitrocellulose layer hardened with an isocyanate may be used. It has been found that when a polymer containing covalently bound chlorine is contained in the heat mode recording layer of a recording material or in an adjacent layer the speed of the recording material can be improved.

The oleophobic surface layer in accordance with the present invention preferably has a thickness of at least 1.0 μm and more preferably at least 1.5 μm. The maximum thickness of the surface layer is not critical but will preferably be not more than 5 μm and more preferably not more than 4 μm. It has been found that the thickness of the oleophobic surface layer influences the printing endurance, sharpness and resolution of the printing plate.

According to the present invention the oleophobic surface layer preferably contains a hardened silicone coating. Preferably the silicone coating contains one or more components one of which is generally a linear silicone polymer terminated with a chemically reactive group at both ends and a multifunctional component as a hardening agent. The silicone coating can be hardened by condensation curing, addition curing or radiation curing.

Condensation curing can be performed by using a hydroxy terminated polysiloxane that can be cured with a multifunctional silane. Suitable silanes are e.g. acetoxy silanes, alkoxy silanes and silanes containing oxime functional groups. Generally the condensation curing is carried out in the presence of one or more catalyst such as e.g. tin salts or titanates. Alternatively hydroxy terminated polysiloxanes can be cured with a polyhydrosiloxane polymer in the presence of a catalyst e.g. dibutyltindiacetate.

Addition curing is based on the addition of Si—H to a double bond in the presence of a platinum catalyst. Silicone coatings that can be cured according to the addition curing thus comprise a vinyl group containing polymer, a platinum catalyst e.g. chloroplatinic acid complexes and a polyhydrosiloxane e.g. polymethylhydrosiloxane. Suitable vinyl group containing polymers are e.g. vinyldimethyl terminated polydimethylsiloxanes and dimethylsiloxane/vinylmethyl siloxane copolymers.

Radiation cure coatings that can be used in accordance with the present invention are e.g. U.V. curable coatings containing polysiloxane polymers containing epoxy groups or electron beam curable coatings containing polysiloxane polymers containing (meth)acrylate groups. The latter coatings preferably also contain multifunctional (meth)acrylate monomers.

What is claimed is:

1. A material for making a lithographic printing plate comprising on a glass support a surface capable of being differentiated in ink accepting and ink repellant areas in accordance with an image pattern, wherein said glass support has a thickness of not more than 0.5 mm, a failure stress of more than $4\times10^7$ Pa and a Youngs' modulus of not more than $10^{11}$ Pa.

2. A material according to claim 1 being imagable by laser ablation and comprising on said glass support a first layer comprising a polymer and a second layer underlying said first layer, at least one of said first and second layer having an efficient absorption of infrared radiation and said first and second layers exhibiting different affinities for a printing fluid selected from the group consisting of ink and an abhesive fluid for ink.

3. A material according to claim 1, comprising on said glass support a photosensitive layer.

4. A material according to claim 1, wherein said surface capable of being differentiated in ink accepting and ink repellant areas comprises a photosensitive layer.

5. A material according to claim 4, wherein said photosensitive layer comprises a diazonium salt, a diazo resin or a photo-cross-linkable composition.

6. A material according to claim 1, comprising on said glass support, in the order given, a photosensitive layer comprising a silver halide and an image receiving layer comprising physical development nuclei.

7. A material according to claim 2, wherein said first layer comprises a polysiloxane.

8. A material according to claim 2, wherein said first layer comprises a conductive polymer layer, an infrared absorbing metal layer or an infrared absorbing compound dispersed in a polymeric binder.

9. A material according to claim 7, wherein said first layer further comprises a conductive polymer layer, an infrared absorbing metal layer or an infrared absorbing compound dispersed in a polymeric binder.

10. A material for making a lithographic printing plate comprising on a glass support a surface capable of being differentiated in ink accepting and ink repellant areas in accordance with an image pattern, wherein i) said glass support has a thickness of not more than 0.5 mm, a failure stress of more than $4\times10^7$ Pa and a Youngs modulus of not more than $10^{11}$ Pa and ii) comprises further on said glass support a hydrophilic layer formed of a cross-linked hydrophilic polymer.

11. A material according to claim 10, wherein said surface capable of being differentiated in ink accepting and ink repellant areas comprises a photosensitive layer.

12. A material according to claim 11, wherein said photosensitive layer comprises a diazonium salt, a diazo resin or a photo-cross-linkable composition.

13. A material according to claim 10, further comprising a layer comprising physical development nuclei on top of said hydrophilic layer.

14. A material according to claim 13, further comprising a photosensitive layer comprising a silver halide emulsion layer on top of said layer comprising physical development nuclei.

15. A method for making a lithographic printing plate/comprising the steps of i) providing a material comprising on a glass support a surface capable of being differentiated in ink accepting and ink repellant areas in accordance with an image pattern, wherein said glass support has a thickness of not more than 0.5 mm, a failure stress of more than $4\times10^7$ Pa and a Youngs modulus of not more than $10^{11}$ Pa, ii) providing on said material an image pattern, such that in said material ink accepting and ink repellant areas become present in accordance with said image pattern.

16. A method according to claim 15, wherein said image pattern is rovided on said material by image-wise exposure.

17. A method according to claim 16, wherein said image-wise exposure comprises a scanning exposure by means of a laser.

18. A method according to claim 16, wherein said image-wise exposure is carried out through said glass support of said material.

19. A method according to claim 17, wherein said image-wise exposure is carried out through said glass support of said material.

20. A method according to claim 15, wherein a substance is image-wise transferred to said glass surface of said material thereby differentiating said surface in ink accepting and ink repellant areas in accordance with the image pattern being transferred.

* * * * *

UNITED STATES PATENT AND TRADEMARK OFFICE

CERTIFICATE OF CORRECTION

PATENT NO. : 6,451,506 B1
DATED : September 17, 2002
INVENTOR(S) : Bart Verlinden et al.

It is certified that error appears in the above-identified patent and that said Letters Patent is hereby corrected as shown below:

Title page,
Item [73], Assignee: "Agra-Gevaert, Mortsel (BE)" should read -- Agfa-Gevaert, Mortsel (BE) --.

Column 16,
Line 22, "plate/" should read -- plate --.
Line 36, "rovided" should read -- provided --.

Signed and Sealed this

Twenty-eighth Day of January, 2003

JAMES E. ROGAN
*Director of the United States Patent and Trademark Office*